(12) United States Patent
Kimura et al.

(10) Patent No.: US 7,943,706 B2
(45) Date of Patent: May 17, 2011

(54) SEMICONDUCTOR ENCAPSULATING EPOXY RESIN COMPOSITION AND SEMICONDUCTOR DEVICE

(75) Inventors: Yasuo Kimura, Gunma-ken (JP); Eiichi Asano, Gunma-ken (JP); Toshio Shiobara, Tokyo (JP); Takayuki Aoki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 130 days.

(21) Appl. No.: 11/386,667

(22) Filed: Mar. 23, 2006

(65) Prior Publication Data

US 2006/0216519 A1 Sep. 28, 2006

(30) Foreign Application Priority Data

Mar. 24, 2005 (JP) ................................. 2005-086259

(51) Int. Cl.
*C08F 283/00* (2006.01)
*B32B 27/38* (2006.01)
*C08G 59/50* (2006.01)
(52) U.S. Cl. .................... 525/524; 428/413; 523/400
(58) Field of Classification Search .................. 428/413; 525/524; 523/400
See application file for complete search history.

(56) References Cited

U.S. PATENT DOCUMENTS

| 5,162,400 | A | * | 11/1992 | Shiobara et al. | ............ | 523/466 |
| 5,190,995 | A | * | 3/1993 | Shiobara et al. | ............ | 523/443 |
| 5,298,548 | A | * | 3/1994 | Shiobara et al. | ............ | 523/443 |
| 5,302,672 | A | * | 4/1994 | Ogura et al. | ................... | 525/481 |
| 5,312,878 | A | * | 5/1994 | Shiobara et al. | ............ | 525/507 |
| 5,340,851 | A | * | 8/1994 | Shiobara et al. | ............ | 523/443 |
| 5,358,980 | A | * | 10/1994 | Shiobara et al. | ............ | 523/427 |
| 5,418,266 | A | * | 5/1995 | Shiobara et al. | ............ | 523/443 |
| 5,827,908 | A | * | 10/1998 | Arai et al. | ..................... | 523/212 |

FOREIGN PATENT DOCUMENTS

| JP | 3137202 B2 | 12/2000 |
| JP | 2005-15689 A | 1/2005 |

* cited by examiner

*Primary Examiner* — Mark Eashoo
*Assistant Examiner* — Megan McCulley
(74) *Attorney, Agent, or Firm* — Birch, Stewart, Kolasch & Birch, LLP

(57) ABSTRACT

An epoxy resin composition comprising (A) at least one epoxy resin comprising (a) a naphthalene ring-containing epoxy resin having at least one substituted or unsubstituted naphthalene ring in a molecule and having an epoxy equivalent of 175 to 210, (B) a phenolic resin having at least one substituted or unsubstituted naphthalene ring in a molecule, and (C) an inorganic filler, the substituted or unsubstituted naphthalene ring of the epoxy resin (a) being contained in an amount of 45 to 60% by weight in the total amount of the epoxy resin (A) is best suited for semiconductor encapsulation because it has good flow, a low coefficient of linear expansion, a high Tg, minimal moisture absorption, and crack resistance upon lead-free soldering.

4 Claims, 1 Drawing Sheet

SEMICONDUCTOR ENCAPSULATING EPOXY RESIN COMPOSITION AND SEMICONDUCTOR DEVICE

CROSS-REFERENCE TO RELATED APPLICATION

This non-provisional application claims priority under 35 U.S.C. §119(a) on Patent Application No. 2005-086259 filed in Japan on Mar. 24, 2005, the entire contents of which are hereby incorporated by reference.

This invention relates to an epoxy resin composition for semiconductor encapsulation which has good flow, a low coefficient of linear expansion, a high glass transition temperature, minimal moisture absorption, and crack resistance upon lead-free soldering. It also relates to a semiconductor device encapsulated with a cured product of the composition.

BACKGROUND ART

The current mainstream of semiconductor devices including diodes, transistors, ICs, LSIs and VLSIs are of the resin encapsulation type. Epoxy resins have superior moldability, adhesion, electrical properties, mechanical properties, and moisture resistance to other thermosetting resins. It is thus a common practice to encapsulate semiconductor devices with epoxy resin compositions. In harmony with the recent market trend of electronic equipment toward smaller size, lighter weight and higher performance, efforts are devoted to the fabrication of semiconductor members of larger integration and the promotion of semiconductor mount technology. Under the circumstances, more stringent requirements including lead elimination from solder are imposed on epoxy resins as the semiconductor encapsulant.

Recently, ball grid array (BGA) and QFN packages characterized by a high density mount become the mainstream of IC and LSI packages. For these packages which are encapsulated only on one surface, the problem of warpage after molding becomes more serious. One approach taken in the prior art for improving warpage is to increase the crosslink density of resins to elevate their glass transition temperature. While lead-free solders require higher soldering temperature, such resins have a higher modulus at higher temperature and high moisture absorption. Thus there are left outstanding problems of delamination at the interface between the cured epoxy resin and the substrate and at the interface between the semiconductor chip and the resin paste after solder reflow. On the other hand, for resins with a lower crosslink density, more inorganic filler loadings are effective for providing low water absorption, a low coefficient of expansion and a low modulus at high temperature and expected to be effective for imparting reflow resistance as well. Regrettably, a concomitant increase of viscosity can compromise the flow during molding.

Japanese Patent No. 3,137,202 discloses an epoxy resin composition comprising an epoxy resin and a curing agent wherein the epoxy resin used is 1,1-bis(2,7-diglycidyloxy-1-naphthyl)alkane. This epoxy resin composition in the cured state has good heat resistance and excellent moisture resistance, and overcomes the drawback that cured products of ordinary high-temperature epoxy resin compositions are hard and brittle.

JP-A 2005-15689 describes an epoxy resin composition comprising (A) an epoxy resin comprising (a1) 1,1-bis(2,7-diglycidyloxy-1-naphthyl)alkane, (a2) 1-(2,7-diglycidyloxy-1-naphthyl)-1-(2-glycidyloxy-1-naphthyl)alkane, and (a3) 1,1-bis(2-glycidyloxy-1-naphthyl)alkane, and (B) a curing agent wherein 40 to 95 parts by weight of (a3) is included per 100 parts by weight of (a1), (a2) and (a3) combined. It is described that inclusion of 40 to 95 parts by weight of the resin of formula (1), shown later, wherein m=n=0 is preferred from the standpoints of flow and curability.

DISCLOSURE OF THE INVENTION

An object of the present invention is to provide an epoxy resin composition which is effective in continuous molding and forms a cured product that exhibits improved crack resistance upon soldering even when the encapsulating resin portion of surface mount packages has absorbed moisture. Another object is to provide a semiconductor device encapsulated with the epoxy resin composition in the cured state.

The inventor has found that by combining a specific epoxy resin, especially of the general formula (1), shown below, with a specific phenolic resin, especially of the general formula (2), shown below, there is obtained an epoxy resin composition which is fully flowable and cures into parts having a low coefficient of linear expansion, a high glass transition temperature (Tg), minimal moisture absorption, and soldering crack resistance.

Accordingly, the present invention provides an epoxy resin composition comprising (A) at least one epoxy resin comprising (a) a naphthalene ring-containing epoxy resin having at least one substituted or unsubstituted naphthalene ring in a molecule and having an epoxy equivalent of 175 to 210, (B) a phenolic resin having at least one substituted or unsubstituted naphthalene ring in a molecule, and (C) an inorganic filler, the substituted or unsubstituted naphthalene ring of the epoxy resin (a) being contained in an amount of 45 to 60% by weight in the total amount of the epoxy resin (A).

In this case, the epoxy resin (a) preferably has the following formula (1):

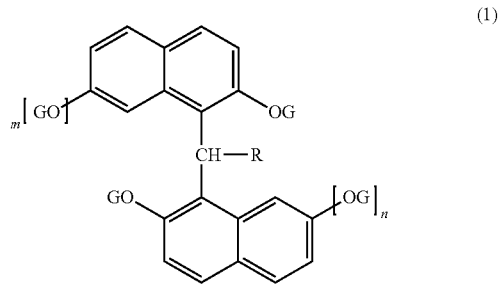

wherein m and n are 0 or 1, R is hydrogen, $C_1$-$C_4$ alkyl or phenyl, and G is a glycidyl-containing organic group, with the proviso that 35 to 85 parts by weight of the resin wherein m=0 and n=0 and 1 to 35 parts by weight of the resin wherein m=1 and n=1 are included per 100 parts by weight of the resin of formula (1).

In a preferred embodiment, the phenolic resin (B) comprises a phenolic resin (b) having the general formula (2):

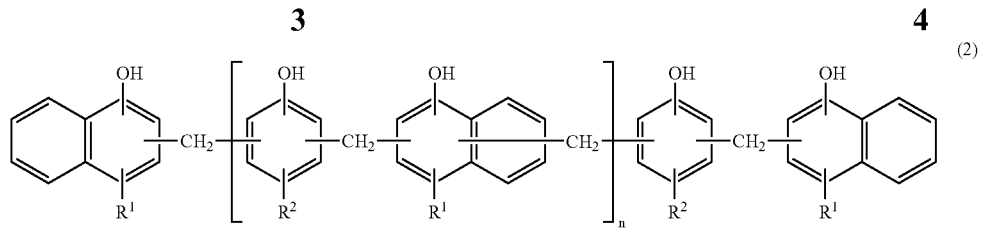

wherein $R^1$ and $R^2$ are each independently hydrogen, $C_1$-$C_4$ alkyl or phenyl, and n is an integer of 0 to 10.

Also contemplated herein is a semiconductor device encapsulated with a cured product of the epoxy resin composition. In a preferred embodiment, the semiconductor device comprises a resin substrate or a metal substrate, and a semiconductor member mounted on one surface of the resin substrate or one surface of the metal substrate, wherein the semiconductor member is encapsulated with the epoxy resin composition substantially solely on the one surface of the resin or metal substrate.

BENEFITS OF THE INVENTION

The epoxy resin composition of the invention is fully flowable and cures into parts having a low coefficient of linear expansion, a high Tg, minimal moisture absorption, and crack resistance upon lead-free soldering. It is best suited for semiconductor encapsulation. The semiconductor device encapsulated with a cured product of the epoxy resin composition is of great worth in the industry.

DESCRIPTION OF THE PREFERRED EMBODIMENTS

Figure 1:
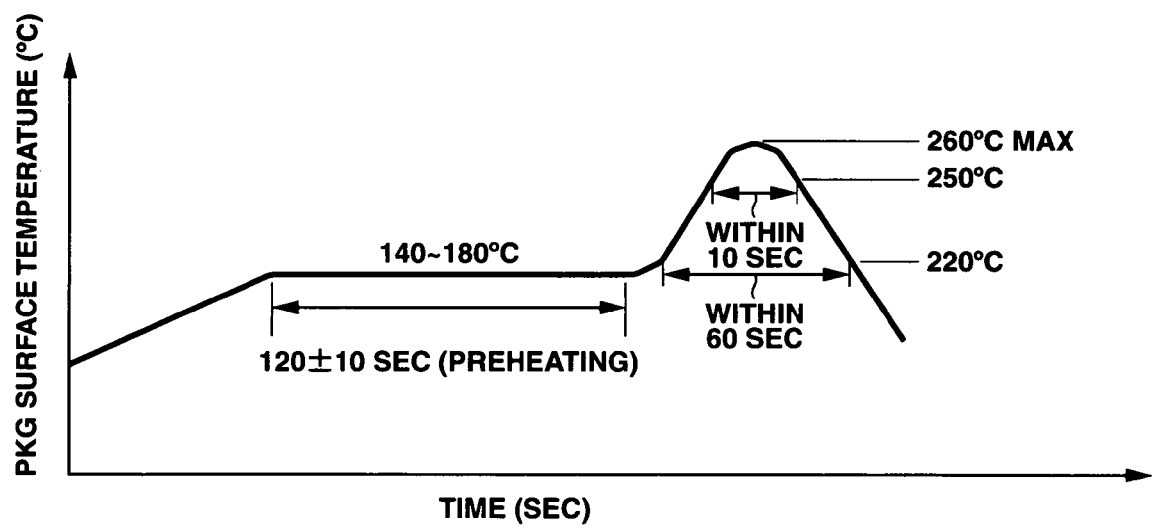
FIG. 1 is a diagrammatic representation of the IR reflow schedule for reflow resistance measurement.

The epoxy resin composition of the invention for semiconductor encapsulation comprises (A) an epoxy resin, (B) a phenolic resin curing agent, and (C) an inorganic filler.

A. Epoxy Resin

The epoxy resin (A) comprises (a) a naphthalene ring-containing epoxy resin having at least one substituted or unsubstituted naphthalene ring in a molecule and having an epoxy equivalent of 175 to 210. The substituted or unsubstituted naphthalene ring of the epoxy resin (a) is contained in an amount of 45 to 60% by weight in the total amount of the epoxy resin (A).

The naphthalene ring included in the epoxy resin can impart a high glass transition temperature and a low moisture absorption. In this case, if the epoxy equivalent is less than 175, the crosslinking density would be increased, the viscosity would be increased, and the flowability would be lowered. If the epoxy equivalent is more than 210, the crosslinking density would be remarkably lowered and the curability and the glass transition temperature would be lowered.

For excellent curability, heat resistance, low moisture absorption, low linear expansion coefficient and high-temperature low elasticity, the content of the substituted or unsubstituted naphthalene ring in the epoxy resin (a) should be 45 to 60% by weight in the total amount of the epoxy resin. If the content of the naphthalene ring is less than 45% by weight, heat resistance and low moisture absorption would be insufficient. If the content of the naphthalene ring is more than 60%, the viscosity would be increased, the flowability would be lowered, and high-temperature elastic coefficient would become high.

In this case, the naphthalene ring-containing epoxy resin (a) is preferably a naphthalene type epoxy resin having the above general formula (1). It is preferred that 35 to 85 parts by weight of the resin wherein m=0 and n=0 and 1 to 35 parts by weight of the resin wherein m=1 and n=1 be present per 100 parts by weight of the resin of formula (1).

If the resin wherein m=0 and n=0 is less than 35 parts by weight per 100 parts by weight of the resin of formula (1), the resin composition has a high viscosity and is less flowable. If the same resin is more than 85 parts by weight, the resin composition undesirably has an extremely low crosslinking density, less curability and a low Tg. If the resin wherein m=1 and n=1 is more than 35 parts by weight per 100 parts by weight of the resin of formula (1), the resin composition has an increased crosslinking density and an increased Tg, but is undesirably increased in modulus of elasticity at high temperature. In order that the epoxy resin composition have satisfactory curability, heat resistance and modulus of elasticity at high temperature, it is preferred that the content of the resin wherein m=0 and n=0 be 45 to 70 parts by weight and the content of the resin wherein m=1 and n=1 be 5 to 30 parts by weight. The residue is the resin wherein m=1 and n=0 or m=0 and n=1.

Specific examples of these epoxy resins are shown below.

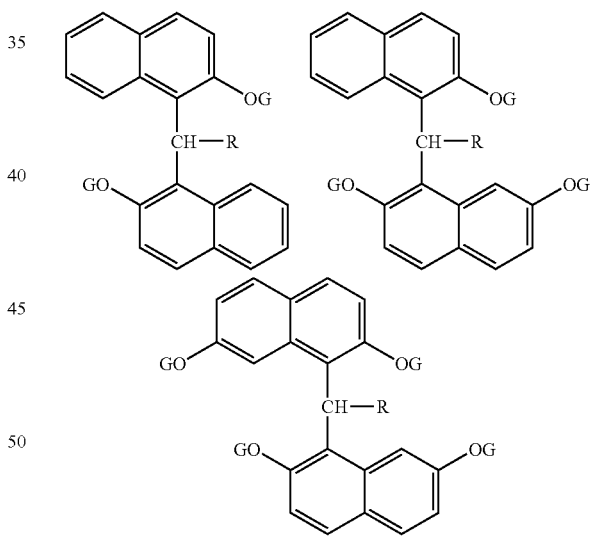

Note that R and G are as defined above.

Illustrative examples of R include hydrogen atoms, alkyl groups such as methyl, ethyl and propyl, and phenyl groups. One typical example of the glycidyl-containing organic group of G is shown below.

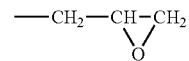

It is described in JP-A 2005-15689 that inclusion of 40 to 95 parts by weight of the resin of formula (1) wherein m=n=0 is preferred from the standpoints of flow and curability. It has been found that the epoxy resin (A) used herein having the same naphthalene structure of formula (1) exhibits good flow, a low coefficient of linear expansion, a high Tg, minimal moisture absorption, and soldering crack resistance when the content of the resin of formula (1) wherein m=1 and n=1 is also limited to a certain range, and when the epoxy equivalent is defined to 175 to 210 and the content of the naphthalene ring is defined to 45 to 60% by weight.

In the inventive composition, another epoxy resin may be used in combination with the naphthalene ring-containing epoxy resin (a) having formula (1) as the epoxy resin component. The other epoxy resin used herein is not critical and is selected from prior art well-known epoxy resins including novolac type epoxy resins (e.g., phenol novolac epoxy resins, cresol novolac epoxy resins), triphenolalkane type epoxy resins (e.g., triphenolmethane epoxy resins, triphenolpropane epoxy resins), biphenyl type epoxy resins, phenol aralkyl type epoxy resins, biphenyl aralkyl type epoxy resins, heterocyclic epoxy resins, naphthalene ring-containing epoxy resins other than formula (1), bisphenol type epoxy resins (e.g., bisphenol A epoxy resins, bisphenol F epoxy resins), stilbene type epoxy resins, and halogenated epoxy resins. The other epoxy resins may be employed alone or in combination of two or more.

It is desired that the naphthalene ring-containing epoxy resin (a) having formula (1) account for 50 to 100% by weight, more preferably 70 to 100% by weight of the entire epoxy resin component (i.e., naphthalene ring-containing epoxy resin (a) of formula (1)+other epoxy resins). If the proportion of the naphthalene ring-containing epoxy resin is less than 50% by weight, some of the desired properties including heat resistance, reflow resistance and moisture absorption may be lost.

B. Curing Agent

A phenolic resin is included in the epoxy resin composition of the invention as a curing agent for the epoxy resin (A). It is a phenolic resin having at least one substituted or unsubstituted naphthalene ring in a molecule. Preferred is a phenolic resin (b) having the general formula (2):

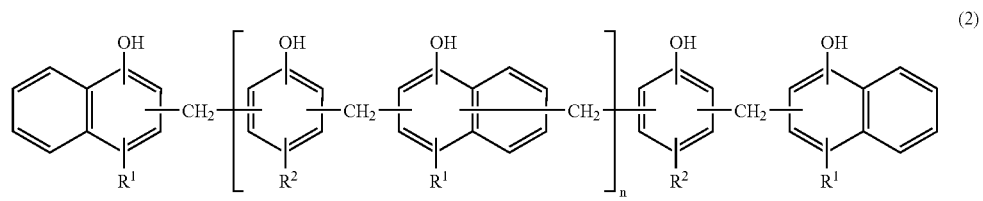

wherein $R^1$ and $R^2$ are each independently hydrogen, $C_1$-$C_4$ alkyl or phenyl, and n is an integer of 0 to 10.

Illustrative examples of $R^1$ and $R^2$ include hydrogen atoms, alkyl groups such as methyl, ethyl and propyl, and phenyl groups.

The use of a curing agent in the form of a naphthalene ring-bearing phenolic resin ensures that the epoxy resin composition in the cured state has a low coefficient of linear expansion, a high Tg, a low modulus of elasticity in a temperature range equal to or above Tg, and minimal water absorption. When the epoxy resin composition is used as an encapsulant for semiconductor devices, the resulting package is improved in crack resistance upon thermal shocks and in warpage. Illustrative examples of the naphthalene ring-bearing phenolic resin having formula (2) include the following compounds (3) to (6).

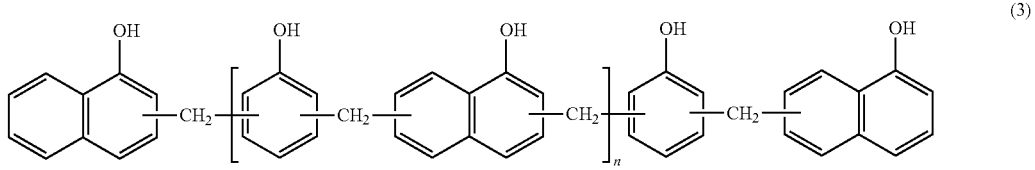

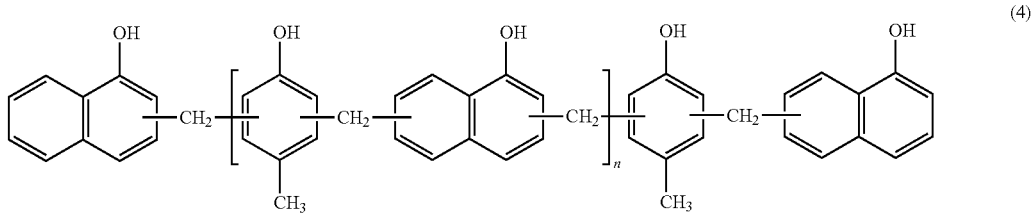

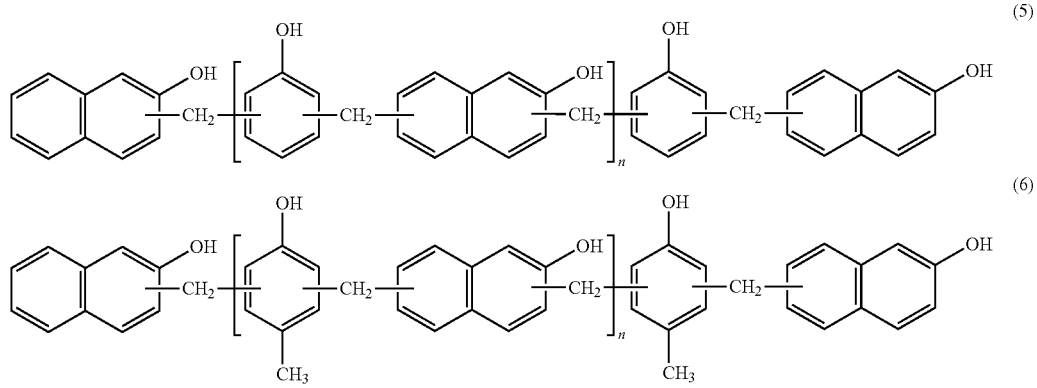

(5)

(6)

As the phenolic resin (B) in the epoxy resin composition of the invention, another phenolic resin may be used in combination with the specific phenolic resin (b) of formula (2). The other phenolic resin is not particularly limited, and use may be made of prior art well-known phenolic resins including novolac type phenolic resins (e.g., phenol novolac resins, cresol novolac resins), phenol aralkyl type phenolic resins, biphenyl aralkyl type phenolic resins, biphenyl type phenolic resins, triphenolalkane type phenolic resins (e.g., triphenolmethane phenolic resins, triphenolpropane phenolic resins), alicyclic phenolic resins, heterocyclic phenolic resins, and bisphenol type phenolic resins (e.g., bisphenol A and bisphenol F phenolic resins). These phenolic resins may be employed alone or in combination of two or more.

It is desired that the naphthalene phenolic resin (b) of formula (2) account for 25 to 100% by weight, more preferably 40 to 80% by weight of the entire phenolic resin component (i.e., naphthalene phenolic resin (b) of formula (2)+ other phenolic resins). If the proportion of the naphthalene phenolic resin is less than 25% by weight, some of the desired properties including heat resistance, moisture absorption and warpage may be lost.

No particular limit is imposed on the proportion of phenolic resin (B) relative to epoxy resin (A). The phenolic resin is preferably used in such amounts that the molar ratio of phenolic hydroxyl groups in the curing agent to epoxy groups in the epoxy resin is from 0.5 to 1.5, and more preferably from 0.8 to 1.2.

C. Inorganic Filler

The inorganic filler (C) included in the epoxy resin compositions of the invention may be any suitable inorganic filler commonly used in epoxy resin compositions. Illustrative examples include silicas such as fused silica and crystalline silica, alumina, silicon nitride, aluminum nitride, boron nitride, titanium oxide, glass fibers, and antimony trioxide. No particular limit is imposed on the average particle size and shape of these inorganic fillers as well as the amount thereof. To enhance the crack resistance upon lead-free soldering and flame retardance, the inorganic filler is preferably contained in a larger amount in the epoxy resin composition insofar as this does not compromise moldability.

With respect to the mean particle size and shape of the inorganic filler, spherical fused silica having a mean particle size of 3 to 30 μm, especially 5 to 25 μm is more preferred. It is noted that the mean particle size can be determined as the weight average value or median diameter in particle size distribution measurement by the laser light diffraction technique, for example.

The amount of the inorganic filler (C) loaded is preferably 200 to 1,100 parts, more preferably 500 to 800 parts by weight per 100 parts by weight of the epoxy resin (A) and curing agent (B) combined. A composition with less than 200 pbw of the inorganic filler may have an increased coefficient of expansion, allowing the packages to undergo more warpage so that more stresses may be applied to the semiconductor devices, detracting from the device performance. Additionally, the resin content relative to the entire composition becomes higher, detracting from moisture resistance and crack resistance. A composition with more than 1,100 pbw of the inorganic filler may have too high a viscosity to mold. The content of inorganic filler is preferably 75 to 91% by weight, more preferably 78 to 89% by weight, even more preferably 83 to 87% by weight based on the entire composition.

The inorganic filler used herein is preferably surface treated beforehand with a coupling agent such as a silane coupling agent or a titanate coupling agent in order to increase the bonding strength between the resin and the inorganic filler. The preferred coupling agents are silane coupling agents including epoxy silanes such as γ-glycidoxypropyltrimethoxysilane, γ-glycidoxypropylmethyldiethoxysilane, γ-isocyanatopropyltriethoxysilane, γ-ureidopropyltriethoxysilane, and β-(3,4-epoxycyclohexyl)ethyltrimethoxysilane; amino silanes such as N-(β-aminoethyl)-γ-aminopropyltrimethoxysilane, γ-aminopropyltriethoxysilane, and N-phenyl-γ-aminopropyltrimethoxysilane; mercapto silanes such as γ-mercaptopropyltrimethoxysilane; and reaction products of imidazole compounds with γ-glycidoxypropyltrimethoxysilane. These coupling agents may be used alone or in admixture. No particular limitation is imposed on the amount of coupling agent used for surface treatment or the method of surface treatment.

In addition to the foregoing components (A) to (C), the encapsulating resin compositions of the invention may further include various additives, if necessary. Exemplary additives include cure accelerators such as imidazole compounds, tertiary amine compounds and phosphorus compounds; stress reducing agents such as thermoplastic resins, thermoplastic elastomers, organic synthetic rubbers, and silicones; parting agents such as carnauba wax and other waxes; coloring agents such as carbon black; flame retardands such as antimony compounds (e.g., antimony trioxide), molybdenum compounds (e.g., zinc molybdate on talc, zinc molybdate on zinc oxide), hydroxides (e.g., aluminum hydroxide and magnesium hydroxide), zinc borate and zinc stannate; and halide ion trapping agents (e.g., hydrotalcite).

For promoting the cure reaction of the epoxy resin with the curing agent (phenolic resin), a cure accelerator is often used. The cure accelerator is not particularly limited as long as it can promote cure reaction. Useful cure accelerators include phosphorus compounds such as triphenylphosphine, tributylphosphine, tri(p-methylphenyl)phosphine, tri(nonylphenyl)phosphine, triphenylphosphine triphenylborane, tetraphenylphosphine tetraphenylborate and triphenylphosphine benzoquinone adduct; tertiary amine compounds such as triethylamine, benzyldimethylamine, α-methylbenzyldimethylamine, and 1,8-diazabicyclo[5.4.0]undecene-7; and imidazole compounds such as 2-methylimidazole, 2-phenylimidazole, and 2-phenyl-4-methylimidazole.

The cure accelerator may be used in an effective amount for promoting the cure reaction of the epoxy resin and curing agent. When the cure accelerator is a phosphorus compound, tertiary amine compound or imidazole compound, it is preferably used in amounts of 0.1 to 3 parts by weight, more preferably 0.5 to 2 parts by weight per 100 parts by weight of the epoxy resin and curing agent combined.

Parting agents which can be used herein include carnauba wax, rice wax, polyethylene, polyethylene oxide, montanic acid, and montan waxes in the form of esters of montanic acid with saturated alcohols, 2-(2-hydroxyethylamino)ethanol, ethylene glycol, glycerin or the like; stearic acid, stearic esters, stearamides, ethylene bisstearamide, ethylene-vinyl acetate copolymers, and the like, alone or in admixture of two or more. The parting agent is desirably included in an amount of 0.1 to 5 parts, more desirably 0.3 to 4 parts by weight per 100 parts by weight of components (A) and (B) combined.

When the components are mixed in a mixer or the like to form a uniform composition, it is preferred for improved shelf stability of the resulting composition to add a silane coupling agent as a wetter to carry out previous surface treatment.

Examples of suitable silane coupling agents include γ-glycidoxypropyltrimethoxysilane, γ-glycidoxypropylmethyldiethoxysilane, γ-glycidoxypropyltriethoxysilane, p-styryltrimethoxysilane, γ-methacryloxypropylmethyldimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropylmethyldimethoxysilane, γ-mercaptopropyltrimethoxysilane, bis(triethoxypropyl)tetrasulfide, and γ-isocyanatopropyltriethoxysilane. No particular limits are imposed on the amount of silane coupling agent used for surface treatment and the surface treating procedure.

Preparation

The inventive epoxy resin compositions may be prepared as a molding material by compounding components (A) to (C) and optional additives in predetermined proportions, intimately mixing these components together in a mixer or the like, then melting and working the resulting mixture in a hot roll mill, kneader, extruder or the like. The mixture is then cooled and solidified, and subsequently ground to a suitable size so as to give a molding material.

The resulting epoxy resin compositions of the invention can be effectively used for encapsulating various types of semiconductor devices. The encapsulation method most commonly used is low-pressure transfer molding. The epoxy resin composition of the invention is preferably molded and cured at a temperature of about 150 to 185° C. for a period of about 30 to 180 seconds, followed by post-curing at about 150 to 185° C. for about 2 to 20 hours.

In this case, the epoxy resin composition of the present invention is effectively used for a semiconductor device in which a semiconductor member is mounted on one surface of a resin substrate or a metal substrate to encapsulate the semiconductor member solely on the one surface of the resin or metal substrate. Therefore, the inventive epoxy resin composition is preferably used for the encapsulation of ball grid array (BGA) and QFN packages.

EXAMPLE

Examples and Comparative Examples are given below for further illustrating the invention, but are not intended to limit the invention.

Examples 1-11 & Comparative Examples 1-10

Epoxy resin compositions for semiconductor encapsulation were prepared by uniformly melt mixing the components shown in Tables 2 and 3 in a hot twin-roll mill, followed by cooling and grinding. The components used are identified below.

Epoxy Resin

Epoxy resins of formula (1) include epoxy resins A, B and C of the following structures having different values of m and n. Epoxy resins (a) to (e) which are mixtures of epoxy resins A, B and C blended in the proportion shown in Table 1 were used as well as an epoxy resin (f) which is a biphenyl aralkyl type epoxy resin NC3000 (Nippon Kayaku Co., Ltd.). Note that G is as defined above.

Epoxy resin A (m=0, n=0)

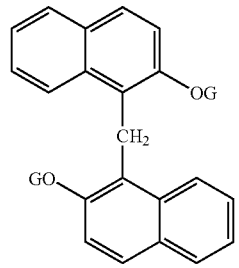

Epoxy resin B (m=1, n=0, or m=0, n=1)

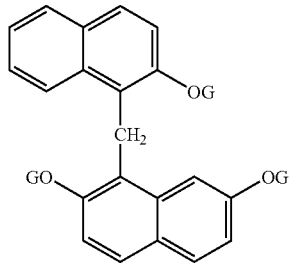

Epoxy resin C (m=1, n=1)

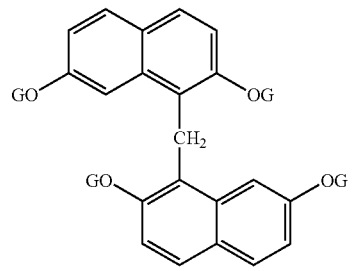

TABLE 1

| (% by weight) | Epoxy resin A | Epoxy resin B | Epoxy resin C | Epoxy equivalent |
|---|---|---|---|---|
| Epoxy resin (a) | 60 | 30 | 10 | 186 |
| Epoxy resin (b) | 50 | 35 | 15 | 180 |
| Epoxy resin (c) | 100 | 0 | 0 | 206 |
| Epoxy resin (d) | 50 | 0 | 50 | 173 |
| Epoxy resin (e) | 0 | 100 | 0 | 162 |

Epoxy resin (f): Biphenyl aralkyl type epoxy resin NC3000 (Nippon Kayaku Co., Ltd.) having an epoxy equivalent of 272 and the following formula:

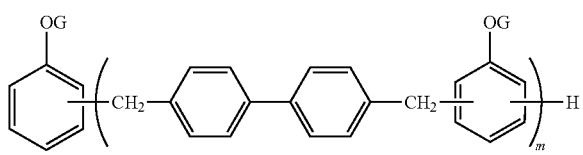

wherein m is 0 to 10.
Phenolic Resin
A phenolic resin (g) has the following formula and a phenol equivalent of 140.

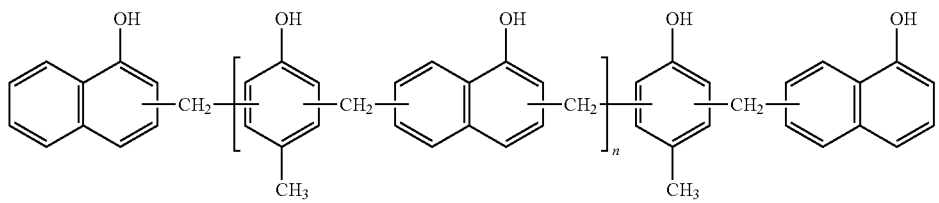

n=0 to 10.
A phenolic resin (h) has the following formula and a phenol equivalent of 140.

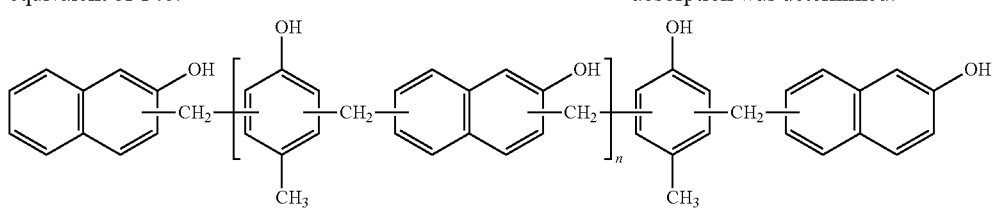

n=0 to 10.
A phenolic resin (i) is a novolac type phenolic resin TD-2131 (Dainippon Ink & Chemicals, Inc.) having the following formula and a phenol equivalent of 110.

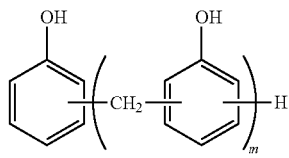

m=0 to 20.
Inorganic Filler
Spherical fused silica by Tatsumori K.K.
Other Additives
Cure accelerator: triphenylphosphine TPP (Hokko Chemical Co., Ltd.)
Parting agent: Carnauba Wax (Nikko Fine Products Co., Ltd.)
Silane coupling agent: γ-glycidoxypropyltrimethoxysilane KBM-403 (Shin-Etsu Chemical Co., Ltd.)
Properties (i) to (vii) of the compositions were measured by the following methods. The results are shown in Tables 2 and 3.
(i) Spiral Flow
Measured by molding at 175° C. and 6.9 N/mm$^2$ for a molding time of 120 seconds using a mold in accordance with EMMI standards.
(ii) Melt Viscosity
Viscosity was measured at a temperature of 175° C. and a pressure of 10 kgf by an extrusion plastometer through a nozzle having a diameter of 1 mm.
(iii) Glass Transition Temperature (Tg) and Coefficient of Linear Expansion (CE)
Measured by molding at 175° C. and 6.9 N/mm$^2$ for a molding time of 120 seconds using a mold in accordance with EMMI standards.
(iv) Moisture Absorption
The composition was molded at 175° C. and 6.9 N/mm$^2$ for 2 minutes into a disc of 50 mm diameter and 3 mm thick and post-cured at 180° C. for 4 hours. The disc was held in a temperature/moisture controlled chamber at 85° C. and 85% RH for 168 hours, following which a percent moisture absorption was determined.
(v) Warpage
A silicon chip of 10×10×0.3 mm was mounted on a bismaleimide triazine (BT) resin substrate of 0.40 mm thick. The composition was transfer molded at 175° C. and 6.9 N/mm$^2$ for 2 minutes and post-cured at 175° C. for 5 hours, completing a package of 32×32×1.2 mm. Using a laser three-dimensional tester, the height of the package was measured in a diagonal direction to determine changes, the maximum change being a warpage.
(vi) Reflow Resistance
The package used in the warpage measurement was held in a temperature/moisture controlled chamber at 85° C. and 60% RH for 168 hours for moisture absorption. Using an IR reflow apparatus, the package was subjected to three cycles of IR reflow under the conditions shown in FIG. 1. Using a ultrasonic flaw detector, the package was inspected for internal cracks and delamination.

TABLE 2

| (parts by weight) | | Epoxy equivalent | Example 1 | Example 2 | Example 3 | Example 4 | Example 5 | Example 6 | Comparative Example 1 | Comparative Example 2 | Comparative Example 3 | Comparative Example 4 | Comparative Example 5 |
|---|---|---|---|---|---|---|---|---|---|---|---|---|---|
| Epoxy resin | (a) | 186 | 5.9 | 5.9 | 4.8 | 6.2 | 6.3 | | | | | 6.5 | |
| | (b) | 181 | | | | | | 5.9 | | | | | |
| | (c) | 206 | | | | | | | 6.0 | | | | |
| | (d) | 173 | | | | | | | | 5.7 | | | |
| | (f) | 272 | | | 1.2 | | | | | | 6.6 | | 7.1 |
| Amount of naphthalene ring in the epoxy resin/Amount of all the epoxy resins used | | | 56.8 | 56.8 | 45.1 | 56.8 | 56.8 | 55.6 | 61.2 | 52.0 | 0 | 56.8 | 0 |
| Phenolic resin | (g) | | 4.1 | | 4.0 | 1.9 | 1.1 | 4.1 | 4.0 | 4.3 | 3.4 | | |
| | (h) | | | 4.1 | | | | | | | | | |
| | (i) | | | | | 1.9 | 2.6 | | | | | 3.5 | 2.9 |
| Inorganic filler | Silica | | 60 | 60 | 60 | 60 | 60 | 60 | 60 | 60 | 60 | 60 | 60 |
| Cure accelerator | TPP | | 0.1 | 0.1 | 0.1 | 0.1 | 0.1 | 0.1 | 0.1 | 0.1 | 0.1 | 0.1 | 0.1 |
| Parting agent | Carnauba Wax | | 0.2 | 0.2 | 0.2 | 0.2 | 0.2 | 0.2 | 0.2 | 0.2 | 0.2 | 0.2 | 0.2 |
| Coupling agent | KBM-403 | | 0.1 | 0.1 | 0.1 | 0.1 | 0.1 | 0.1 | 0.1 | 0.1 | 0.1 | 0.1 | 0.1 |
| Spiral flow, cm | | | 130 | 140 | 128 | 129 | 125 | 126 | 145 | 105 | 120 | 120 | 115 |
| Melt viscosity, Pa·s | | | 7 | 6 | 8 | 8 | 8 | 8 | 5 | 12 | 11 | 10 | 10 |
| Tg, °C. | | | 153 | 150 | 144 | 147 | 142 | 155 | 133 | 160 | 132 | 140 | 140 |
| CE, ppm | | | 8 | 7 | 8 | 8 | 8 | 7 | 9 | 7 | 11 | 12 | 13 |
| Moisture absorption, % | | | 0.15 | 0.16 | 0.16 | 0.16 | 0.19 | 0.17 | 0.18 | 0.2 | 0.18 | 0.27 | 0.26 |
| Warpage, μm | | | 28 | 35 | 38 | 45 | 56 | 22 | 120 | 20 | 250 | 230 | 350 |
| Reflow resistance: crack, defective samples/Test samples | | | 0/20 | 0/20 | 0/20 | 0/20 | 0/20 | 0/20 | 0/20 | 4/20 | 0/20 | 8/20 | 5/20 |
| Reflow resistance: delamination, defective samples/Test samples | | | 0/20 | 0/20 | 0/20 | 0/20 | 0/20 | 0/20 | 0/20 | 9/20 | 0/20 | 15/20 | 10/20 |

TABLE 3

| (parts by weight) | | Epoxy equivalent | Example 7 | Example 8 | Example 9 | Example 10 | Example 11 | Comparative Example 6 | Comparative Example 7 | Comparative Example 8 | Comparative Example 9 | Comparative Example 10 |
|---|---|---|---|---|---|---|---|---|---|---|---|---|
| Epoxy resin | (a) | 186 | 5.9 | 6.5 | 6.2 | | | | 1.3 | 4.5 | | |
| | (b) | 181 | | | | 5.9 | 6.1 | | | | | |
| | (c) | 206 | | | | | | 5.2 | | | | |
| | (e) | 162 | | | | | | | | | 6.0 | |
| | (f) | 272 | | | | | | | 5.2 | 1.9 | | 6.8 |
| Amount of naphthalene ring in the epoxy resin/Amount of all the epoxy resins used | | | 56.8 | 56.8 | 56.8 | 55.6 | 55.6 | 61.2 | 11.4 | 39.8 | 52.0 | 0 |
| Phenolic resin | (g) | | 4.1 | | 1.9 | 4.1 | 1.2 | 4.8 | 3.5 | 1.8 | 2.0 | 1.6 |
| | (i) | | | 3.5 | 1.9 | | 2.7 | | | 1.8 | 2.0 | 1.6 |
| Inorganic filler | Silica | | 60 | 60 | 60 | 60 | 60 | 60 | 60 | 60 | 60 | 60 |
| Cure accelerator | TPP | | 0.1 | 0.1 | 0.1 | 0.1 | 0.1 | 0.1 | 0.1 | 0.1 | 0.1 | 0.1 |
| Parting agent | Carnauba Wax | | 0.2 | 0.2 | 0.2 | 0.2 | 0.2 | 0.2 | 0.2 | 0.2 | 0.2 | 0.2 |
| Coupling agent | KBM-403 | | 0.1 | 0.1 | 0.1 | 0.1 | 0.1 | 0.1 | 0.1 | 0.1 | 0.1 | 0.1 |
| Spiral flow, cm | | | 130 | 140 | 135 | 126 | 134 | 80 | 145 | 110 | 94 | 150 |
| Melt viscosity, Pa·s | | | 7 | 5 | 6 | 8 | 7 | 20 | 6 | 10 | 18 | 5 |
| Tg, °C. | | | 153 | 145 | 150 | 152 | 148 | 155 | 132 | 142 | 144 | 120 |
| CE, ppm | | | 8 | 9 | 8 | 8 | 8 | 7 | 10 | 9 | 9 | 12 |
| Moisture absorption, % | | | 0.15 | 0.16 | 0.15 | 0.15 | 0.16 | 0.15 | 0.18 | 0.17 | 0.17 | 0.20 |
| Warpage, μm | | | 28 | 35 | 30 | 31 | 34 | 26 | 80 | 55 | 35 | 110 |
| Reflow resistance: crack, defective samples/Test samples | | | 0/20 | 0/20 | 0/20 | 0/20 | 0/20 | 0/20 | 0/20 | 1/20 | 0/20 | 1/20 |
| Reflow resistance: delamination, defective samples/Test samples | | | 0/20 | 0/20 | 0/20 | 0/20 | 0/20 | 6/20 | 2/20 | 4/20 | 8/20 | 10/20 |

Japanese Patent Application No. 2005-086259 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An epoxy resin composition used for encapsulation of a semiconductor device comprising a resin substrate or a metal substrate and a semiconductor member mounted solely on one surface of the resin substrate or on one surface of the metal substrate,
wherein the semiconductor member is encapsulated solely on the one surface of the resin or metal substrate with a cured product of an epoxy resin composition comprising
(A) an epoxy resin comprising (a) a naphthalene ring-containing epoxy resin having an epoxy equivalent of 175 to 210, the naphthalene ring-containing epoxy resin being a mixture of the following epoxy resins (i), (ii), and (iii):

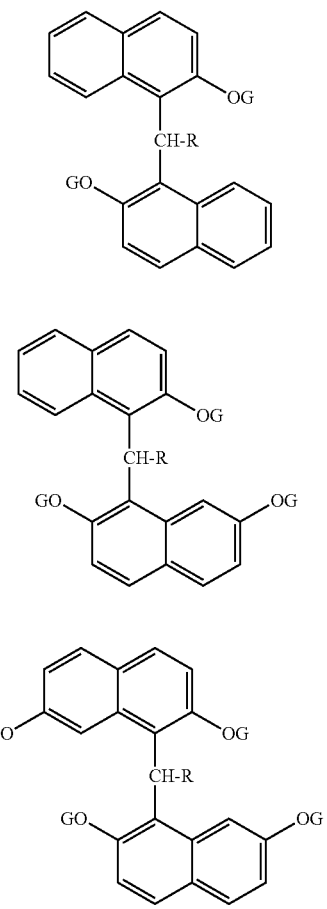

wherein R is hydrogen, $C_1$-$C_4$ alkyl, or phenyl, and G is a glycidyl-containing organic group,
with the proviso that 45 to 70 parts by weight of the epoxy resin (i) and 5 to 30 parts by weight of the epoxy resin (iii) are included per 100 parts by weight of the mixture, with the remainder of the mixture being epoxy resin (ii), and
the naphthalene ring-containing epoxy resin (a) comprises 100% by weight of the entire epoxy resin component (A), (B) a phenolic resin comprising (b) a naphthalene ring-containing phenolic resin having the following formula (4):

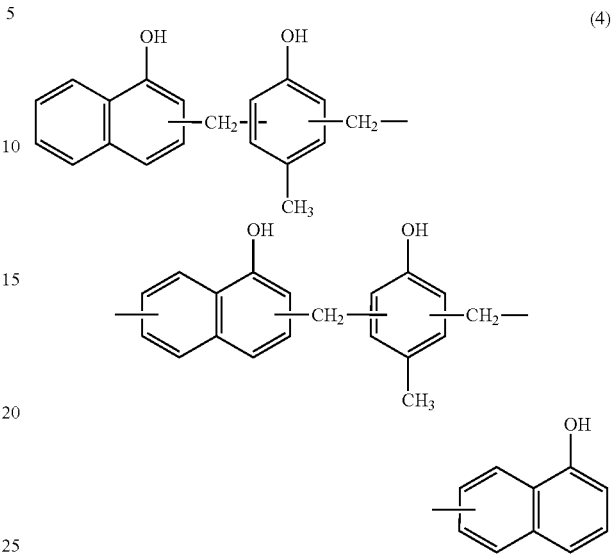

wherein n is an integer of 0 to 10, and
the naphthalene ring-containing phenolic resin (b) of formula (4) comprises 100% by weight of the entire phenolic resin component (B) in such an amount that the molar ratio of phenolic hydroxyl groups in the curing agent to epoxy groups in the epoxy resin is from 0.5 to 1.5, and
(C) an inorganic filler in an amount of 200 to 1100 parts by weight of the epoxy resin (A) and curing agent (B) combined,
wherein the substituted or unsubstituted naphthalene ring of the epoxy resin (a) is contained in an amount of 45 to 60% by weight in the total amount of the epoxy resin (A).

2. The epoxy resin composition of claim 1, wherein the epoxy resin (iii) is present in an amount of 5 to 15 parts by weight per 100 parts by weight of the mixture.

3. A semiconductor device comprising a resin substrate or a metal substrate and a semiconductor member mounted solely on one surface of the resin substrate or on one surface of the metal substrate, wherein the semiconductor member is encapsulated with a cured product of an epoxy resin composition solely on the one surface of the resin or metal substrate, said epoxy resin composition comprising
(A) an epoxy resin comprising (a) a naphthalene ring-containing epoxy resin having an epoxy equivalent of 175 to 210, the naphthalene ring-containing epoxy resin being a mixture of the following epoxy resins (i), (ii), and (iii):

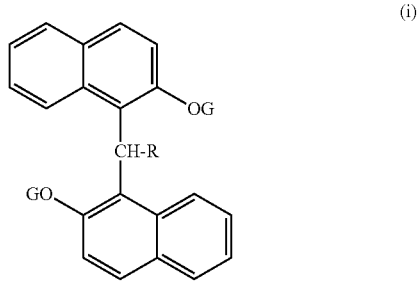

(ii)

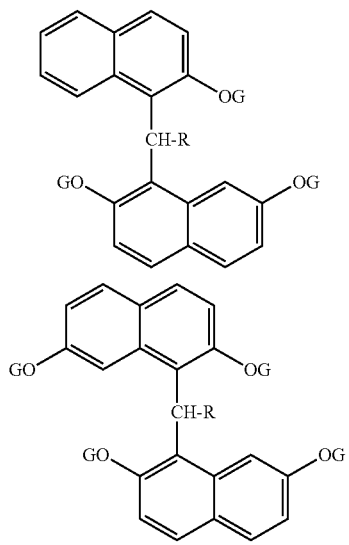

(iii)

wherein R is hydrogen, $C_1$-$C_4$ alkyl, or phenyl, and G is a glycidyl-containing organic group,
  with the proviso that 45 to 70 parts by weight of the epoxy resin (i) and 5 to 30 parts by weight of the epoxy resin (iii) are included per 100 parts by weight of the mixture, with the remainder of the mixture being epoxy resin (ii), and
  the naphthalene ring-containing epoxy resin (a) comprises 100% by weight of the entire epoxy resin component (A),
(B) a phenolic resin comprising (b) a naphthalene ring-containing phenolic resin having the following formula (4):

(4)

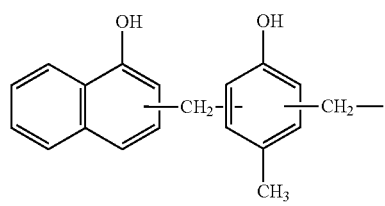

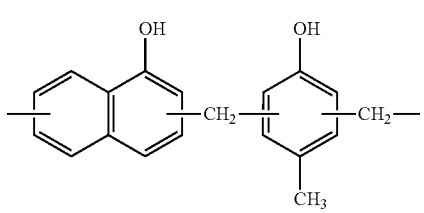

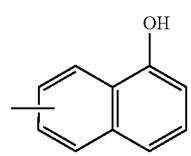

wherein n is an integer of 0 to 10, and the naphthalene ring-containing phenolic resin (b) of formula (4) comprises 100% by weight of the entire phenolic resin component (B) in such an amount that the molar ratio of phenolic hydroxyl groups in the curing agent to epoxy groups in the epoxy resin is from 0.5 to 1.5, and (C) an inorganic filler in an amount of 200 to 1100 parts by weight of the epoxy resin (A) and curing agent (B) combined, wherein the substituted or unsubstituted naphthalene ring of the epoxy resin (a) is contained in an amount of 45 to 60% by weight in the total amount of the epoxy resin (A), whereby the semiconductor device in which the semiconductor member is mounted and encapsulated with the cured product of the epoxy resin composition solely on the one surface of the substrate has improved resistance to warpage.

4. The semiconductor device of claim 3, wherein the epoxy resin (iii) is present in an amount of 5 to 15 parts by weight per 100 parts by weight of the mixture.

* * * * *